(12) United States Patent
Nakajima et al.

(10) Patent No.: US 8,723,537 B2
(45) Date of Patent: May 13, 2014

(54) PROBE INSPECTING METHOD AND CURABLE RESIN COMPOSITION

(75) Inventors: Gosuke Nakajima, Shibukawa (JP); Yoshitsugu Goto, Shibukawa (JP); Kazuhiro Oshima, Shibukawa (JP); Jun Watanabe, Shibukawa (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 802 days.

(21) Appl. No.: 12/919,314

(22) PCT Filed: Feb. 20, 2009

(86) PCT No.: PCT/JP2009/053046
§ 371 (c)(1),
(2), (4) Date: Nov. 24, 2010

(87) PCT Pub. No.: WO2009/107558
PCT Pub. Date: Sep. 3, 2009

(65) Prior Publication Data
US 2011/0128023 A1    Jun. 2, 2011

(30) Foreign Application Priority Data
Feb. 26, 2008  (JP) .................................. 2008-044939

(51) Int. Cl.
*G01R 31/00*    (2006.01)
(52) U.S. Cl.
USPC .................................................... 324/750.03
(58) Field of Classification Search
CPC .. G01R 31/2874; G01R 31/2875; G01R 3/00; G01R 31/3012
USPC ................. 324/762.01–762.1, 228, 239, 243; 257/48; 439/14–18; 522/175, 182
See application file for complete search history.

(56) References Cited

U.S. PATENT DOCUMENTS

| | | | |
|---|---|---|---|
| 2005/0107497 A1 | 5/2005 | Akaho et al. | |
| 2005/0222293 A1* | 10/2005 | Kitano et al. | ................. 522/6 |
| 2007/0218374 A1* | 9/2007 | Kitano et al. | ................. 430/14 |
| 2007/0229098 A1 | 10/2007 | Kobayashi et al. | |

FOREIGN PATENT DOCUMENTS

| | | |
|---|---|---|
| JP | 2001 189353 | 7/2001 |
| JP | 2004 176032 | 6/2004 |
| JP | 2004 327805 | 11/2004 |
| JP | 2005 079253 | 3/2005 |

(Continued)

OTHER PUBLICATIONS

International Search Report issued May 19, 2009 in PCT/JP09/053046 filed Feb. 20, 2009.

*Primary Examiner* — Tung X Nguyen
(74) *Attorney, Agent, or Firm* — Oblon, Spivak, McClelland, Maier & Neustadt, L.L.P.

(57) ABSTRACT

Disclosed are a probe inspecting method for confirming the state of a probe for inspecting electric characteristics of an object to be inspected; and a curable resin composition for use in the method. The method is applied to repeat inspections and comprises the steps of bringing a cured resin of a curable resin composition into contact with a probe for inspecting electric characteristics of an object to be inspected, transferring a probe mark of the probe to the cured resin, confirming the state of the probe based on the transferred probe mark, and, after the transfer of the probe mark of the probe, heating the cured resin to a temperature at or above the glass transition temperature of the cured resin to erase the probe mark of the probe.

16 Claims, 1 Drawing Sheet

(56) References Cited

FOREIGN PATENT DOCUMENTS

| | | |
|---|---|---|
| JP | 2005 308549 | 11/2005 |
| JP | 2007 200934 | 8/2007 |
| JP | 2007 204736 | 8/2007 |
| JP | 2007 273026 | 10/2007 |

* cited by examiner

PROBE INSPECTING METHOD AND CURABLE RESIN COMPOSITION

This application is a 371 of PCT/JP2009/053046 filed Feb. 20, 2009. Priority to Japanese patent application 2008-044939, filed Feb. 26, 2008, is claimed.

TECHNICAL FIELD

The present invention relates to an inspection method for inspecting the condition of probes, a curable resin composition used in a probe inspection process, a cured resin obtained by curing said curable resin composition, and an inspection device comprising a sheet consisting of said cured resin.

BACKGROUND ART

In order to determine whether or not IC chips formed on a wafer by a semiconductor fabrication process are good, a probe device is usually used to inspect the electrical properties. When inspecting the electrical properties of an IC chip using a probe device, the probes must be positioned so as to bring electrode pads on the IC chip into contact with the probes provided on a probe card.

Conventionally, probe positioning is performed by taking an image of the needle tips of the probes using a CCD camera or the like, and determining the positions of the probe tips based on the X-Y coordinate positions at this time. However, with this method, time is required to focus the camera onto the tips of the probes, so that probe positioning can take a long time.

Additionally, while the tips of the probes must be inserted to a certain depth in order to achieve electrical contact between the electrode pads on the IC chip and the probes, the positions of the tips of the probes can sometimes be deflected in a certain direction during insertion. However, in conventional probe positioning methods, the positions of the tips of the probes are determined in a non-contact state, without any consideration of deflection occurring at the time of contact.

In order to overcome the above problems, probe inspection methods and probe inspection devices provided with a material for transcribing probe marks have been proposed, wherein probe marks of the probes are transcribed onto the material and the probes are positioned on the basis of the transcribed probe marks.

For example, in Patent Document 1, probe marks of a plurality probes of a probe card are transcribed onto a deformable material before inspection, and the depths of insertion of the probes into the electrodes are calculated on the basis of the size of the probe mark apertures, thereby reducing the time necessary to position the probes.

Additionally, Patent Document 2 proposes an inspection method and inspection device wherein a support is provided inside a probe inspection device, a sheet for making probe marks is provided on the support, and the probes are positioned on the basis of the transcribed probe marks.

Additionally, Patent Document 3 proposes a probe mark evaluation method wherein an image of probe marks transcribed by a probe mark evaluating wafer is obtained, and the imaged probe marks are superimposed onto virtual electrode pads.

Additionally, Patent Document 4 describes a method wherein probes are brought into contact with a probe position adjusting film composed of an elastomeric composition to form marks, the positional relationship between these marks and the electrode portions of an integrated circuit are observed, and the positions of probes are adjusted based on this positional relationship.

Additionally, Patent Document 5 describes a method wherein a transparent film is applied over a detection substrate on which electrodes are formed, and the positions of probe marks transcribed onto the transparent film and the positions of electrodes on the substrate are compared to position the probes at a high precision without affecting the repeated precision of stage movement.

However, while Patent Document 1 describes heating the deformable material to efface the probe marks for reuse, only low-melting point metals, alloys or organic insulators are suggested as possible materials for the deformable material, and there is no indication of specific materials and heating conditions for achieving reuse. Additionally, in Patent Document 2, the transcription positions of probe marks must be moved each time a plurality of probe marks are transcribed, and there is a limit to the number of repetitions. Furthermore, if the probes are displaced from certain positions, they may overlap with previously transcribed probe marks. Additionally, there is no description of any methods for reusing the sheet aside from moving the probe mark transcription positions.

Additionally, Patent Documents 3 and 4 do not mention reuse of the probe mark transcription materials. In particular, in Patent Document 4, the probe marks are provided with heat resistance so that the probe marks will not disappear, so it is difficult to remove the probe marks for reuse.

Additionally, in Patent Document 5, the detection substrate can be reused by reducing the adhesiveness of the transparent film by irradiation with UV rays to remove the film, but there is no description of the method of reusing the transparent film.

Patent Document 1: JP2001-189353A
Patent Document 2: JP2004-327805A
Patent Document 3: JP2007-200934A
Patent Document 4: JP2005-308549A
Patent Document 5: US2007/0229098A

SUMMARY OF THE INVENTION

The purpose of the present invention is to offer an inspection method enabling repeated probe inspection without requiring replacement of the material for transcribing probe marks with each inspection or type of wafer. Additionally, the invention offers a curable resin composition enabling probe marks to be easily transcribed by contacting probes and the probe marks to be easily removed by a simple method.

That is, the present invention offers a probe inspection method used for repeated inspections, comprising steps of contacting probes for inspection of electrical properties of an object of inspection to a cured resin of a curable resin composition; transcribing probe marks of the probes to the cured resin; checking the condition of the probes based on the transcribed probe marks; and after transcribing the probe marks, heating the cured resin to at least the glass transition temperature of the cured resin to remove the probe marks.

The above inspection method provides the effects of enabling repeated probe inspection without requiring replacement of the material for transcribing probe marks with each inspection or type of wafer.

Additionally, the present invention offers a curable resin composition for transcribing probe marks of probes, comprising (A) a monofunctional (meth)acrylate and/or (meth)acrylamide, and (C) a photopolymerization initiator, having a glass transition temperature of 130° C. or less.

According to the above curable resin composition, probe marks can be easily transcribed by bringing a material for transcribing probe marks into contact with probes, and the probe marks can be easily effaced by heating the material for transcribing probe marks to at least the glass transition temperature.

Additionally, the present invention offers an inspection device for inspecting the electrical properties of an object of inspection, comprising a sheet consisting of a cured resin obtained by curing a resin composition comprising (A) a monofunctional (meth)acrylate and/or (meth)acrylamide, and (C) a photopolymerization initiator, having a glass transition temperature of 130° C. or less; a support for holding the sheet; a heating device for heating the sheet to at least the glass transition temperature of the cured resin; a pedestal for holding an object of inspection; a probe card having probes, and an imaging device for observing the condition of probe marks transcribed onto the sheet.

According to the above inspection device, probe marks can be easily transcribed by contact with probes, and the probe marks can be easily removed by heating to at least the glass transition temperature, so repeated probe inspections are possible without requiring replacement of the material for transcribing the probe marks with each inspection or type of wafer.

Explanation of Reference Numbers

| | |
|---|---|
| 10 | sheet |
| 11 | probe marks |
| 12 | support |
| 13 | pedestal |
| 14 | probe card |
| 15 | probe |
| 16 | CCD camera (imaging device) |
| W | wafer |

MODES FOR CARRYING OUT THE INVENTION

Explanation of Terminology

In the present specification, "curable resin composition" refers to a mixture that can be cured to form a cured resin by irradiation with light or by heating. Additionally, in general, curable resin compositions have a temperature range known as a glass transition temperature to be described next.

In the present specification, "glass transition temperature" refers to the temperature at which a substance reversibly changes from a liquid state (rubber state) to an amorphous solid (glass state), or reversibly changes from an amorphous solid (glass state) to a liquid state (rubber state). In general, the glass transition temperature is defined, for example, by JIS C 6481 or the like.

Additionally, in the present specification, the symbol "~" refers to "at least" and "at most"; for example, "A~B" refers to being at least A and at most B.

[History of the Invention]

The present inventors discovered that probe marks can be transcribed onto a cured resin of a curable resin composition by bringing it into contact with probes, that the probe marks can then be effaced by heating the cured resin to at least the glass transition temperature, and that the probe marks transcribed on the cured resin can be observed at the same time and in the same focus as reference positions formed on a wafer by obtaining the cured resin of the curable resin composition in the form of a thin film.

Embodiment 1

Curable Resin Composition

The curable resin composition of the present embodiment is a curable resin composition for transcribing probe marks of probes, comprising (A) a monofunctional (meth)acrylate and/or (meth)acrylamide, and (C) a photopolymerization initiator, having a glass transition temperature of 130° C. or less.

According to the above curable resin composition, probe marks can be easily transcribed by bringing a material for transcribing probe marks into contact with probes, and the probe marks can be easily effaced by heating the material for transcribing probe marks to at least the glass transition temperature.

First, the constitution of the curable resin composition of the present embodiment shall be explained.
(Curable Resin Composition)

While the curable resin composition is not particularly limited, it is characterized by comprising (A) a monofunctional (meth)acrylate and/or (meth)acrylamide, and (C) a photopolymerization initiator, and having a glass transition temperature of 130° C. or less.

Herebelow, the components of the curable resin composition shall be explained.

The curable resin composition preferably contains (A) a monofunctional (meth)acrylate monomer or (meth)acrylamide. By using a cured resin of an acrylic type curable resin composition, probe marks can be easily transcribed by contact with probes, and the probe marks can be easily effaced by heating to at least the glass transition temperature.
(Monofunctional (Meth)Acrylate Monomer)

Examples of monofunctional (meth)acrylate monomers include methyl (meth)acrylate, ethyl (meth)acrylate, propyl (meth)acrylate, butyl (meth)acrylate, 2-ethylhexyl (meth)acrylate, isomyristyl (meth)acrylate, isooctyl (meth)acrylate, isodecyl (meth)acrylate, lauryl (meth)acrylate, stearyl (meth)acrylate, phenyl (meth)acrylate, butoxyethyl (meth)acrylate, cyclohexyl (meth)acrylate, dicyclopentanyl (meth)acrylate, dicyclopentenyl (meth)acrylate, dicyclopentenyloxyethyl (meth)acrylate, isobornyl (meth)acrylate, methoxylated cyclodecatoriene (meth)acrylate, 2-hydroxyethyl (meth)acrylate, 2-hydroxypropyl (meth)acrylate, 3-hydroxypropyl (meth)acrylate, 4-hydroxybutyl (meth)acrylate, tetrahydrofurfuryl (meth)acrylate, 2-hydroxy-3-phenoxypropyl (meth)acrylate, glycidyl (meth)acrylate, polycaprolactone-modified hydroxyethyl (meth)acrylate, (meth)acryloyl-terminated polyacrylate, caprolactone-modified tetrahydrofurfuryl (meth)acrylate, 3-chloro-2-hydroxypropyl (meth)acrylate, N,N-dimethylaminoethyl (meth)acrylate, N,N-diethylaminoethyl (meth)acrylate, t-butylaminoethyl (meth)acrylate, alkoxyalkyl (meth)acrylates such as ethoxycarbonylmethyl (meth)acrylate and butoxyethyl (meth)acrylate, phenol ethylene oxide-modified acrylates, phenol (2 mole ethylene oxide modified) acrylate, phenol (4 mole ethylene oxide modified) acrylate, paracumyl phenol ethylene oxide-modified acrylates, nonylphenol ethylene oxide modified acrylate, nonylphenol (4 mole ethylene oxide modified) acrylate, nonylphenol (8 mole ethylene oxide modified) acrylate, nonylphenol (2.5 mole propylene oxide modified) acrylate, 2-ethylhexylcarbitol acrylate, ethylene oxide modified phthalic acid (meth)acrylate, ethylene oxide modified succinic acid (meth)acrylate, trifluoroethyl (meth)acrylate, ω-carboxy-polycaprolactone mono(meth)acrylate, phthalic acid monohydroxyethyl (meth)acrylate, (meth)acrylic acid dimers, β-(meth)acryloyloxyethylhydrogen succinate, and n-(meth)acryloyloxyalkylhexahydrophthalimide.

These monofunctional (meth)acrylate monomers are preferred for their ability to provide probe mark transcribability.

Among these, one or more types chosen from among isobornyl (meth)acrylate, isodecyl (meth)acrylate, 2-hydroxyethyl (meth)acrylate and butoxyethyl (meth)acrylate are preferred for being highly effective.

When using only (A) a monofunctional (meth)acrylate as the curable resin composition, one or more chosen from the group consisting of butyl (meth)acrylate, 2-hydroxyethyl (meth)acrylate, isobornyl (meth)acrylate and isodecyl (meth)acrylate are preferable, among which isobornyl (meth)acrylate and/or isodecyl (meth)acrylate are more preferable, and the combined use of isobornyl (meth)acrylate and isodecyl (meth)acrylate is most preferable.

When using both isobornyl (meth)acrylate and isodecyl (meth)acrylate, the ratio of isobornyl (meth)acrylalte and isodecyl (meth)actylate used, when assuming the isobornyl (meth)acrylate and isodecyl (meth)acrylate total 100 parts by mass, should be such that isobornyl (meth)acrylate:isodecyl (meth)acrylate=80~99 parts by mass: 1~20 parts by mass, and 85~95 parts by mass: 5~15 parts by mass is more preferable.

As a result, it is possible to provide probe mark transcribing ability over a temperature range from room temperature to high temperatures.

When using a combination of (A) a monofunctional (meth)acrylate and (B) a polyfunctional (meth)acrylalte as the curable resin composition, the (A) monofunctional (meth)acrylate should preferably be isobornyl (meth)acrylate and/or butoxyethyl (meth)acrylate, and the combined use of isobornyl (meth)acrylate and butoxyethyl (meth)acrylate is more preferable.

When using both isobornyl (meth)acrylate and butoxyethyl (meth)acrylate, the ratio of isobornyl (meth)acrylalte and butoxyethyl (meth)actylate used, when assuming the isobornyl (meth)acrylate and butoxyethyl (meth)acrylate total 100 parts by mass, should be such that isobornyl (meth)acrylate:butoxyethyl (meth)acrylate=40~80 parts by mass: 20~60 parts by mass, and 50~70 parts by mass: 30~50 parts by mass is more preferable.

As a result, the adhesiveness of the curable resin composition can be improved.

((Meth)Acrylamide)

Additionally, examples of (meth)acrylamides include N-isopropyl (meth)acrylamide, N,N-dimethyl (meth)acrylamide, N,N-diethyl (meth)acrylamide, N-hydroxyethyl (meth)acrylamide and (meth)acryloyl morpholine.

These acrylamides are preferred for having good surface curability.

Of these, N,N-diethyl (meth)acrylamide and/or (meth)acryloyl morpholine are preferred for being highly effective, and N,N-diethyl (meth)acrylamide is more preferable.

Among (A) monofunctional (meth)acrylates and/or (meth)acrylamides, monofunctional (meth)acrylates are preferable for being highly effective.

The amount of (A) monofunctional (meth)acrylate and/or (meth)acrylamide added, when assuming the (A) monfuntional (meth)acrylate and/or (meth)acrylamide and the (B) polyfunctional (meth)acylate components to be described below to total 100 parts by mass, should preferably be 40~100 parts by mass, and more preferably 45~55 parts by mass.

These amounts are preferable because they enable sufficiently deep probe marks to be transcribed onto the cured resin.

Additionally, the monofunctional (meth)acrylates and/or (meth)acrylamides can be used singly, or as a combination of two or more types.

((B) Polyfunctional (Meth)Acrylate)

The above-described curable resin composition may further comprise (B) a polyfunctional (meth)acrylate.

While there is no particular restriction on the (B) polyfunctional (meth)acrylate, it is preferable to use a polyfunctional (meth)acrylate oligomer/polymer/monomer having at least two (meth)acryloyl groups. By adding a polyfunctional (meth)acrylate to the curable resin composition, it is possible to prevent the resin melting during heating.

While the polyfunctional (meth)acrylate oligomer/polymer is not particularly restricted, examples include 1,2-polybutadiene-terminated (meth)acrylates (e.g., Nippon Soda TE-2000 and TEA-1000), hydrides of the above (e.g., Nippon Soda TEAI-1000), 1,4-polybutadiene-terminated urethane (meth)acrylates (e.g., Osaka Organic Chemical BAC-45), polyisoprene-terminated (meth)acrylates, polyester urethane (meth)acrylates, polyether urethane (meth)acrylates, polyester (meth)acrylates, bisphenol A type epoxy (meth)acrylates (e.g., Osaka Organic Chemical Biscoat #540 and Showa Highpolymer Biscoat VR-77).

Of these, 1,2-polybutadiene-terminated urethane (meth)acrylates and/or their hydrides are preferable for being highly effective, and hydrides of 1,2-polybutadiene-terminated urethane (meth)acrylate are more preferable. These polyfunctional (meth)acrylate oligomers/polymers are preferable for improved handling ability and prevention of melting when heated.

Additionally, there are no particular restrictions on the polyfunctional (meth)acrylate monomers, but the following are preferred.

Examples of bifunctional (meth)acrylate monomers include 1,3-butylene glycol di(meth)acrylate, 1,4-butanediol di(meth)acrylate, 1,6-hexanediol di(meth)acrylate, 1,9-nonanediol di(meth)acrylate, neopentylglycol di(meth)acrylate, dicyclopentanyl di(meth)acrylate, 2-ethyl-2-butyl-propanediol (meth)acrylate, neopentylglycol-modified trimethylolpropane di(meth)acrylate, stearic acid-modified pentaerythritol diacrylate, polypropylene glycol di(meth)acrylate, 2,2-bis(4-(meth)acryloxydiethoxyphenyl)propane, 2,2-bis(4-(meth)acryloxypropoxyphenyl)propane, and 2,2-bis(4-(meth)acryloxytetraethoxyphenyl)propane.

Examples of trifunctional (meth)acrylate monomers include trimethylolpropane tri(meth)acrylate and tris[meth)acryloxyethyl]isocyanurate.

Examples of tetrafunctional and greater (meth)acrylate monomers include dimethylolpropane tetra(meth)acrylate, pentaerythritol tetra(meth)acrylate, pentaerythritol ethoxytetra(meth)acrylate, dipentaerythritol penta(meth)acrylate and dipentaerythritol hexa(meth)acrylate.

The above-described polyfunctional (meth)acrylate monomers are preferable for preventing melting when heated.

Regarding the combination of the (A) monofunctional (meth)acrylate and/or (meth)acrylamide and the (B) polyfunctional (meth)acrylate, it is preferable to use a monofunctional (meth)acrylate and/or a (meth)acrylamide and not use a polyfunctional (meth)acrylate for the ability to easily efface probe marks after heating.

When using a combination of (A) a monofunctional (meth)acrylate and (B) a polyfunctional (meth)acrylate as the curable resin composition, the amount of the (B) polyfunctional (meth)acrylate added, assuming that the components (A) and (B) total 100 parts by mass, should preferably be 60 parts by mass or less, more preferably 45~55 parts by mass. If the amount of (B) polyfunctional (meth)acrylate added is 60 parts by mass or less, then probe marks can be transcribed to a depth sufficient to recognize the probe marks in the resin after curing.

Additionally, the composition blending components (A) and (B) may also include a phosphoric acid ester having vinyl groups or (meth)acryloyl groups such as (meth)acryloyloxyethyl acid phosphate, dibutyl 2-(meth)acryloyloxyethyl acid phosphate, dioctyl 2-(meth)acryloyloxyethyl phosphate, diphenyl 2-(meth)acryloyloxyethyl phosphate, and (meth)acryloyloxyethyl polyethylene glycol acid phosphate.

As a result, the adhesion to metal surfaces can be further improved.

((C) Photopolymerization Initiator)

The above-described curable resin composition may further contain a photopolymerization initiator in addition to the above components (A) and (B). The (C) photopolymerization initiator is added for the purpose of increasing the sensitivity by means of activating light rays such as visible light rays or UV rays to promote photocuring of the resin composition, and various publicly known photopolymerization initiators may be preferably used.

While the (C) photopolymerization initiator is not particularly restricted, examples include benzophenone and its derivatives, benzyl and its derivatives, anthraquinone and its derivatives, benzoin and benzoin derivatives such as benzoin methyl ether, benzoin ethyl ether, benzoin propyl ether, benzoin isobutyl ether and benzyldimethylketal, acetophenone derivatives such as diethoxyacetophenone and 4-t-butyltrichloroacetophenone, 2-dimethylaminoethylbenzoate, p-dimethylaminoethylbenzoate, diphenyldisulfide, thioxanthone and its derivatives, camphor quinone and camphor quinone derivatives such as 7,7-dimethyl-2,3-dioxobicyclo[2.2.1]heptane-1-carboxylic acid,
7,7-dimethyl-2,3-dioxobicyclo[2.2.1]heptane-1-carboxy-2-bromoethyl ester and
7,7-dimethyl-2,3-dioxobicyclo[2.2.1]heptane-1-carboxylic acid chloride,
α-aminoalkylphenone derivatives such as
2-methyl-[4-(methylthio)phenyl]-2-morpholinopropane-1-one and
2-benzyl-2-dimethylamino-1-(4-morpholinophenyl)-butane-1, and acylphosphine oxide derivatives such as benzoyldiphenylphosphine oxide,
2,4,6-trimethylbenzoyldiphenylphosphine oxide, benzoyldiethoxyphosphine oxide,
2,4,6-trimethylbenzoyldimethoxyphenylphosphine oxide and
2,4,6-trimethylbenzoyldiethoxyphenylphosphine oxide.

Of these, the benzoin derivatives and α-aminoalkylphenone derivatives are preferable for being highly effective, and benzyldimethylketal and 2-methyl-1-[4-(methylthio)phenyl]-2-morpholinopropane-1-one is more preferable.

The photopolymerization initiator may be used singly or as a combination of two or more of the above-described substances.

The amount of the (C) photopolymerization initiator to be added, when assuming the above-described (A) and (B) to total 100 parts by mass, should preferably be 0.1~20 parts by mass. If at least 0.1 parts by mass of the photopolymerization initiator are added, then a curing promotion effect can certainly be obtained, and if at most 20 parts by mass are added, then a sufficient curing rate can be achieved.

The amount of the (C) photopolymerization initiator to be added should more preferably be 0.5~10 parts by mass. By adding this amount, a cured resin with sufficient adhesive strength can be obtained.

(Polymerization Inhibitor)

The above-described curable resin composition may contain a polymerization inhibitor for improving the storage stability thereof.

While the polymerization inhibitor is not particularly restricted, examples include methylhydroquinone, hydroquinone,
2,2-methylene-bis(4-methyl-6-tertiary-butylphenol), pentaerythritol
tetrakis(2-(3,5-di-tertiary-butyl-4-hydroxyphenyl)propionate,
octadecyl-3-(3,5-di-tertiary-butyl-4-hydroxyphenyl)propionate,
isooctyl-3-(3,5-di-tertiary-butyl-4-hydroxyphenyl)propionate, catechol, hydroquinone
monomethyl ether, mono-tertiary-butylhydroquinone, 2,5-di-tertiary-butylhydroquinone,
p-benzoquinone, 2,5-diphenyl-p-benzoquinone, 2,5-di-tertiary-butyl-p-benzoquinone,
picric acid, citric acid, phenothiazine, tertiary-butylcatechol, 2-butyl-4-hydroxyanisole,
2,6-di-tertiary-butyl-p-cresol and 4-methoxy-1-naphthol.

Of these, 2,2-methylene-bis(4-methyl-6-tertiary-butylphenol) is preferable for being highly effective.

The amount of the polymerization inhibitor to be contained, when assuming the above-described (A) and (B) to total 100 parts by mass, should preferably be 0.001~3 parts by mass. If the polymerization inhibitor content is at least 0.001 parts by mass, the storage stability is sufficient, and if at most 3 parts by mass, adhesiveness can be reliably obtained, and there is no possibility of incomplete curing.

The polymerization inhibitor content should more preferably be 0.01~2 parts by mass. As a result, the effects of further improved storage stability and durability can be achieved.

Additionally, the above-described curable resin composition may also contain commonly used additives, including various elastomers such as acrylic rubber, urethane rubber and acrylonitrile-butadiene-styrene rubber, inorganic fillers, solvents, extenders, enhancers, plasticizers, thickeners, dyes, pigments, fire retardants, silane couplers and surfactants.

(Thickness of Cured Resin)

The cured resin of the curable resin composition may be obtained as a thin film. By obtaining the cured resin of the curable resin composition as a thin film, the probe marks transcribed onto the cured resin of the curable resin composition can be observed at the same time and with the same focus as reference positions on the wafer, thus reducing work time.

The thickness of the cured resin should preferably be 20~100 μm, more preferably 40~60 μm. If the thickness of the cured resin is at least 20 μm, a continuous cured resin can be reliably obtained. Additionally, if the thickness of the cured resin is at most 100 μm, it can be adapted to the thickness of common semiconductor wafers, so that the probe marks transcribed onto the cured resin can be observed at the same time and with the same focus as reference positions on the wafer.

Embodiment 2

Probe Inspection Method

The probe inspection method of the present embodiment is a probe inspection method for repeated inspection, comprising steps of contacting a cured resin of a curable resin composition with probes for inspecting the electrical properties of an object of inspection, transcribing probe marks of the probes to a cured resin, checking the condition of the probes based on the transcribed probe marks, and after transcribing the probe marks, heating the cured resin to at least the glass transition temperature of the cured resin to efface the probe marks.

The above-described inspection method provides the effects of enabling probe inspection to be repeatedly performed without requiring replacement of the material on which the probe marks are transcribed with each inspection or type of wafer. However, "without requiring replacement" does not mean that the material for transcribing the probe marks does not need to be replaced ever. In other words, it should be replaced as necessary due to normal deterioration and wear, but can be repeatedly used at least two or more times.

Next, the above-mentioned probe inspection method will be explained.

First, probes used for inspection are brought into contact with the cured resin of the curable resin composition, so as to transcribe probe marks from the probes onto the cured resin. Additionally, after checking the transcribed probe marks, wafer inspection is performed using the probes. At this time, if the above check reveals that the positions of the probes are not appropriate, or the depth of insertion is not adequate, then the probes can be adjusted as needed.

In this case, contact refers to pressing probes onto the surface of a cured resin so as to form probe marks of the probes on the surface of the cured resin. This operation forms probe marks on the surface of the cured resin. Additionally, transcribing refers to forming probe marks on the surface of the cured resin by means of the above-described contact. By transcribing probe marks onto the surface of a cured resin in this way, the positions and depths of insertion of the probes, and the conditions of the tips of the probes can be known.

Additionally, checking refers to visual observation of the transcribed probe marks using an imaging device such as a CCD camera. While the probe marks should preferably be checked by eye for reliability, it is possible to analyze an image taken by the imaging device by means of software, and automatically correct the probe arrangement.

The temperature during contact and transcription should be the same temperature as the temperature of inspection of the electrical properties of the IC chips, and for example, may be about room temperature, 20~30° C., or higher at 80~90° C. Additionally, the temperature during the check should be the same as the above temperature or lower.

After completing inspection of a predetermined number of wafers, the cured resin is heated to at least the glass transition temperature of the cured resin to efface the probe marks from the probe. Additionally, effacement of the probe marks may be performed each time a different type of wafer is inspected.

In this case, effacement of the probe marks refers to heating the cured resin to raise the temperature of the cured resin to at least the glass transition temperature, so as to erase the probe marks formed on the surface of the cured resin. Effacement of the probe marks does not necessarily require the probe marks to be completely eliminated.

For example, they can be considered to be effaced if the gap in height between the bottommost portion of the probe marks and the surface of the cured resin is 100 nm or less. More preferably, they can be considered to be effaced if the gap becomes 50 nm or less.

The probe marks can be checked as to whether or not they have been effaced by visual observation using an imaging device. By removing the probe marks formed on the surface of the cured resin, it is possible to repeatedly perform a plurality of inspections using a single cured resin.

In the above-described inspection, the cured resin is obtained by curing a curable resin composition by illuminating with light or heating, and while not particularly restricted, should preferably be the curable resin composition described in Embodiment 1.

As a result, the probe marks can be easily transcribed by contacting the probes, and the probe marks can be easily effaced by heating to at least the glass transition temperature, so they can be favorably used for inspection of the probes. Additionally, after effacing the probe marks, they can be reused by cooling to the temperature of contact, transcribing and checking.

The above inspection method provides the effect of enabling probe inspection to be repeatedly performed without needing to replace the material for transcribing the probe marks with each inspection or type of wafer.

Additionally, when inspecting an object of inspection at a high temperature, the probe marks can be transcribed to the cured resin as long as the temperature is below the glass transition temperature, and the temperature of the cured resin can be made the same as the temperature during inspection of the object of inspection. Even if the temperature is above the glass transition temperature, the temperature of the cured resin can be made the same as the temperature during inspection of the object of inspection as long as it is possible to transcribe probe marks to the cured resin. In other words, the positions of the tips of the probes can be detected at high temperatures. As a result, even when inspecting the object of inspection at high temperatures, the probes can be brought into precise contact with electrode pads without the positions of the probe tips becoming displaced from the positions during detection.

(Inspection Device)

Figure 1:
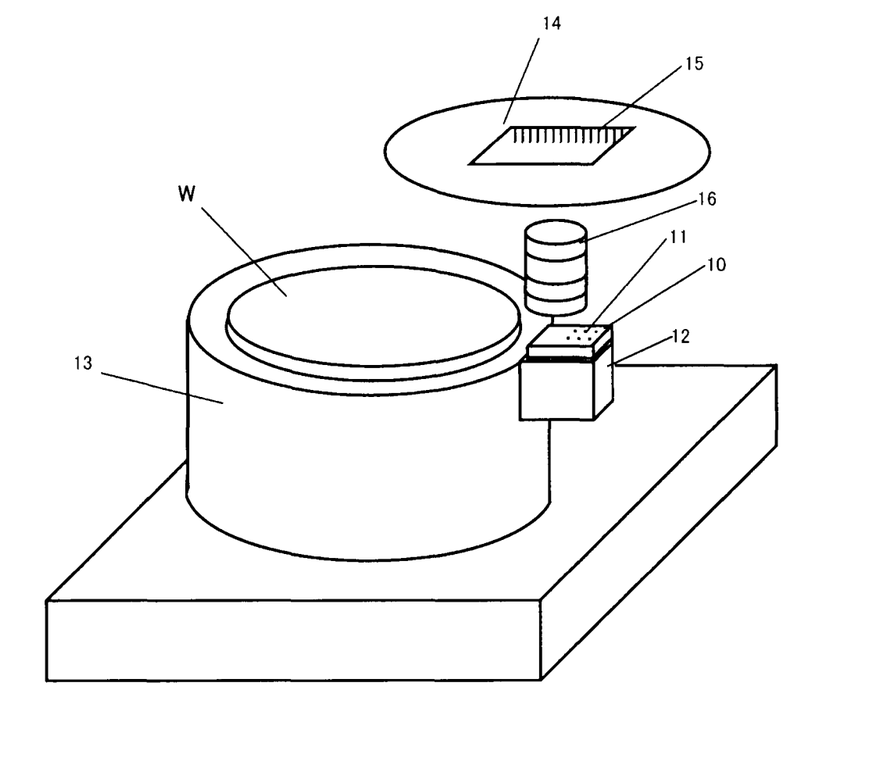
FIG. 1 A drawing for explaining an inspection device according to Embodiment 2.

As shown in FIG. 1, the above-described probe inspection can be performed by an inspection device comprising a sheet 10 consisting of a cured resin, a support 12 on which said sheet 10 is mounted, a heating device (not shown) for heating said sheet 10 to at least the glass transition temperature of said cured resin, a pedestal 13 on which said object of inspection is placed, a probe card 14 having probes 15, and an imaging device 16 for checking the stated of the probe marks 11 of the probe 15 transcribed to said sheet 10.

The components of the inspection device are not limited to the above, and it may also include a vacuum pump, a gas supply, or a control mechanism for controlling movement of the pedestal. Additionally, the above inspection device may be incorporated into a device such as a vacuum chamber.

(Method of Heating Curable Resin Composition)

The curable resin composition according to Embodiments 1 and 2 is such that, after contacting the probes subsequent to curing to transfer the probe marks, the probe marks can be effaced by heating to at least the glass transition temperature.

In Embodiments 1 and 2, the glass transition temperature of the curable resin composition can be obtained by a simple heating method. While the heating method is not particularly limited, an electric heater or dryer is preferable for their ease of use.

The heating temperature should preferably be 180° C. or less, and more preferably 50~150° C. A heating temperature of 180° C. or less is preferable because the curable resin composition will be able to withstand multiple uses.

Additionally, in Embodiment 2, the heating device refers, for example, to an electric heater, dryer or the like. While the heating device must be capable of heating the temperature of the sheet 10 to at least the glass transition temperature, it should be provided in a manner not affecting other materials or objects of inspection.

In addition to heating alone, the method for effacement of the probe marks may combine heating and compression. By compressing, the surface of the cured resin can be kept even flatter. The method of compression of the curable resin composition should preferably be to use a conventionally known device such as a press.

(Glass Transition Temperature)

In Embodiments 1 and 2, the glass transition temperature should preferably be at least 40° C. and at most 130° C. Within this range, the temperature can be easily reached by means of an electric heater or dryer. Furthermore, the glass transition temperature should preferably be at least 40° C. and at most 120° C., and at least 50° C. and at most 100° C. In this range, the probe marks can be transcribed to an adequate depth in the cured resin in the temperature range from room temperature to high temperatures.

Additionally, while the curable resin compositions of Embodiments 1 and 2 can be repeatedly used, the number of repetitions should preferably be at least two, and when considering cost, should preferably be able to be used at least thirty times.

The probe inspection method according to an embodiment of the present invention is a probe inspection method for repeated inspection, comprising steps of contacting a cured resin of a curable resin composition with probes for inspecting the electrical properties of an object of inspection, transcribing probe marks of the probes to a cured resin, checking the condition of the probes based on the transcribed probe marks, and after transcribing the probe marks, heating the cured resin to at least the glass transition temperature of the cured resin to efface the probe marks.

The above-described inspection method provides the effect of enabling repeated inspection of probes without requiring replacement of the material for transcribing the probe marks with each inspection or type of wafer.

The thickness of the cured resin of the curable resin composition may be 20~100 μm, preferably 40~60 μM. As a result, the probe marks transcribed onto the cured resin can be observed at the same time and with the same focus as the reference positions formed on the wafer, thereby reducing work time.

Additionally, marks may be made on the cured resin of the curable resin composition as reference positions. While the marks may be made by application of ink by inkjet, screen printing, metal vapor deposition or laser ablation. Ink is preferably applied by inkjet for its ease of processing and ability to withstand repeated use.

Additionally, in the above-described probe inspection method, the curable resin composition may comprise (A) monofunctional (meth)acrylate and/or (meth)acrylamide, and (C) a photopolymerization initiator, and have a glass transition temperature of 130° C. or less.

As a result, probe marks can be easily transcribed by contacting probes, and the probe marks can be easily effaced by heating to at least the glass transition temperature, so it can be repeatedly used for probe inspection.

Additionally, in the above-described probe inspection method, the curable resin composition may further comprise (B) a polyfunctional (meth)acrylate. As a result, it is possible to prevent melting of the resin when heated.

Additionally, in the above-described probe inspection method, the curable resin composition may further comprise a polymerization inhibitor. As a result, the storage stability and durability are improved.

The curable resin composition according to an embodiment of the present invention is a curable resin composition for transcribing probe marks, characterized by comprising (A) a monofunctional (meth)acrylate and/or (meth)acrylamide, and (C) a photopolymerization initiator, having a glass transition temperature of 130° C. or less.

According to the above-described curable resin composition, probe marks can be easily transcribed by contacting probes, and the probe marks can be easily effaced by heating to at least the glass transition temperature.

Additionally, the above-described curable resin composition may further contain (B) a polyfunctional (meth)acrylate. As a result, the resin can be prevented from melting after heating.

Additionally, the above-described curable resin composition may further comprise a polymerization inhibitor. As a result, the storage stability and durability can be increased.

Additionally, the above-described curable resin composition may, with respect to a total of 100 parts by mass of (A) and (B), comprise 40~100 parts by mass of (A), 60 parts by mass or less of (B) and 0.1~20 parts by mass of (C).

The cured resin obtained by curing the above-described curable resin composition can easily transcribe probe marks by contact with probes, and the probe marks can be easily effaced by heating to at least the glass transition temperature, so it can be repeatedly used for inspection of probes.

Additionally, the present invention offers an inspection device for inspecting the electrical properties of an object of inspection, comprising a sheet consisting of the above-described cured resin, a support for holding the sheet, a heating device for heating the sheet to at least the glass transition temperature of the cured resin, a pedestal for holding an object of inspection, a probe card having probes, and an imaging device for observing the condition of probe marks transcribed onto the sheet.

This inspection device is capable of performing repeated inspection of the probes without requiring replacement of the materials for transcribing the probe marks with each inspection or type of wafer, thereby enabling the time for the inspection steps to be shortened.

As described above, embodiments of the present invention have been described, but these are merely illustrative of the present invention, and various other structures aside from the above may be employed.

EXAMPLES

Herebelow, the present invention shall be explained in further detail with reference to examples and comparative examples.

Example 1

The respective materials were mixed in the following compositions, to prepare a curable resin composition.

(A) Monofunctional (Meth)Acrylate 30 parts by mass of isobornyl methacrylate (Kyoeisha Chemical Light-Ester IB-X, hereinafter abbreviated to "IB-X") and 20 parts by mass of butoxyethylmethacrylate (Kyoeisha Chemical Light-Ester BO, hereinafter abbreviated to "BO").

(B) Polyfunctional (Meth)Acrylate 1,2-polybutadiene-terminated urethane acrylate hydride (Nippon Soda TEAI-1000, hereinafter abbreviated to "TEAI-1000").

(C) Photopolymerization Initiator

With respect to 100 parts by mass of the composition consisting of the above (A) and (B), 1 part by mass of 2-methyl-1-[4-(methylthio)phenyl]-2-morpholinopropane-1-one (Ciba Specialty Chemicals IRGAURE 907, hereinafter abbreviated to "I-907").

Polymerization Inhibitor

With respect to 100 parts by mass of the composition consisting of the above (A) and (B), 0.1 parts by mass of 2,2-methylene-bis(4-methyl-6-tertiary-butylphenol) (hereinafter abbreviated to "MDP").

Using the resulting curable resin composition, the tensile shear bond strength was measured, and probe mark transcribing ability and probe mark effacing ability were evaluated by means of the evaluation methods described below.

(Measurement of Glass Transition Temperature)

The glass transition temperature was measured by a differential thermal analyzer "SII EXSTAR DSC6220" (Seiko Instruments) (temperature increase rate 10° C./min).

(Measurement of Tensile Shear Bond Strength)

The tensile shear bond strength was measured in accordance with the JIS K 6850 standard. Specifically, heat resistant Pyrex® glass (25 mm×25 mm×2.0 mm) was prepared, and two pieces of the heat resistant Pyrex® glass were bonded together using a prepared curable resin composition with the diameter of the bonding area being 8 mm, then cured by a curing device from Fusion, using an electrodeless discharge lamp under conditions of wavelength 365 nm and a cumulative light quantity of 2000 mJ/cm², thereby resulting in a test piece for measuring the tensile shear bond strength. Then, a universal testing machine was used to measure the tensile shear bond strength of the resulting test piece at a temperature of 23° C. and relative humidity of 50%, and a pulling rate of 10 mm/min.

(Evaluations of Probe Mark Transcribing Ability and Probe Mark Effacing Ability)

The curable resin composition was applied to a thickness of 50 μm onto a silicon wafer, then cured by a Fusion curing device under conditions of wavelength 365 nm and a cumulative light quantity of 4000 mJ/cm², to produce a test piece. A manual prober was used to lower the probes 40 μm at a speed of about 15 μm/s, bringing them into contact with the cured resin of the curable resin composition above the silicon wafer. When contacted by the probes, the cured resin of the curable resin composition had a temperature of 25° C.

Then a confocal laser microscope was used to observe whether or not the probe marks were transferred to the surface of the cured resin of the curable resin composition. The probe mark transcribing ability of Table 1 was measured as the depth of the probe marks when the above-described probe marks were formed on the surface of a cured resin of the curable resin composition. The depth of the probe marks was measured by a confocal laser microscope (Olympus OLS 1100).

The test pieces on which the probe marks were transcribed were heated for 10 minutes at 140° C., then checked for effacement of the probe marks. They were then measured for the presence of probe marks and the thickness of the probe marks using a confocal laser microscope (Olympus OLS 1100).

The results of the above-described experiments are shown in Table 1.

TABLE 1

| | | EX1 | EX2 | EX3 | EX4 | EX5 | EX6 | EX7 | EX8 | EX9 | CE1 | CE2 |
|---|---|---|---|---|---|---|---|---|---|---|---|---|
| Component (A) (parts by mass) | IB-X | 30 | 30 | 30 | — | — | — | 30 | — | — | — | — |
| | BO | 20 | 20 | 20 | 30 | — | — | 20 | — | — | — | — |
| | 2-HEMA | — | — | — | — | 20 | — | — | — | — | — | — |
| | ACMO | — | — | — | 70 | — | — | — | — | — | 100 | — |
| | IB-XA | — | — | — | — | — | — | — | 90 | 90 | — | — |
| | ID | — | — | — | — | — | — | — | 10 | 10 | — | — |
| | DEAA | — | — | — | — | 30 | 100 | — | — | — | — | — |
| Component (B) (parts by mass) | TEAI-1000 | 50 | 50 | 50 | — | 50 | — | — | — | — | — | — |
| | TEA-1000 | — | — | — | — | — | — | 50 | — | — | — | — |
| | R684 | — | — | — | — | — | — | — | — | — | — | 100 |
| Component (C) (parts by mass) | I-907 | 1 | 1 | 1 | 10 | 5 | 15 | — | — | — | 5 | 5 |
| | BDK | — | — | — | — | — | — | 5 | 10 | 10 | — | — |
| Polymerization Inhibitor (parts by mass) | MDP | 0.1 | 0.1 | 0.1 | 0.1 | 0.1 | 0.1 | 0.1 | 1 | 1 | 0.1 | 0.1 |
| Glass Transition Temperature (° C.) | — | 55 | 55 | 55 | 95 | 40 | 81 | 55 | 73 | 73 | 145 | 180 |
| Cured resin Thickness (μm) | — | 50 | 30 | 100 | 50 | 50 | 50 | 50 | 50 | 50 | 50 | 50 |
| Bond Strength (MPa) | — | 14.2 | 14.2 | 14.2 | 9.3 | 12.1 | 5.0 | 12.7 | 7.2 | 7.2 | 6.0 | 7.2 |
| Probe Mark Transcription (Probe Mark Depth μm) | — | 8.23 | 8.44 | 7.82 | 2.21 | 8.56 | 5.29 | 8.08 | 2.30 | 7.21* | 2.54 | 0.07 |
| Probe Marks After Heating to 140° C. | — | 0.00 | 0.00 | 0.00 | 0.00 | 0.00 | 0.00 | 0.00 | 0.00 | 0.00 | 2.21 | 0.07 |

*Probe Mark Transcription Temperature: 85° C.

Examples 2-9

A curable resin composition was made in the same manner as Example 1, except that the raw materials of the types shown in Table 1 were used in the compositions shown in Table 1. The resulting curable resin compositions were evaluated in the same manner as Example 1. The results are shown in Table 1.

The probe mark transcription of Example 9 was evaluated at 85° C.

(Materials Used)

Herebelow, the materials used in Examples 2-9 and their abbreviations will be explained. These abbreviations correspond to those in Table 1.

TEA-1000: 1,2-polybutadiene-terminated urethane acrylate (Nippon Soda TEA-1000)
ACMO: acryloylmorpholine (Kojin ACMO)
2-HEMA: 2-hydroxyethylmethacrylate (Mitsubishi Gas Chemical 2-HEMA)
DEAA: diethylacrylamide (Kojin DEAA)
IB-XA: isobornyl acrylate (Kyoeisha Chemical IB-XA)
ID: isodecyl methacrylate (Kyoeisha Chemical ID)
BDK: benzyldimethylketal Comparative Examples 1 and 2

A resin composition was made in the same manner as Example 1 aside from the use of the raw materials of the types shown in Table 1 and the compositions shown in Table 1. Evaluations were performed on the resulting resin compositions in the same manner as Example 1. The results are shown in Table 1.

(Materials Used)

Herebelow, the materials used in Comparative Examples 1 and 2 and their abbreviations will be explained. These abbreviations correspond to those in Table 1.

R-684: dicyclopentanyl diacrylate (Nippon Kayaku KAYARAD R-684)

[Analysis]

As is clear from Table 1, in Examples 1-9, probe marks were able to be transcribed, and the probe marks were able to be effaced by heating. In other words, by using the curable resin composition of the present invention, probes were able to be repeatedly inspected without requiring replacement of the material for transcribing the probe marks with each inspection or type of wafer.

However, as opposed to Examples 1-9, while the probe marks were able to be transcribed in Comparative Example 1, it was not heated to at least the glass transition temperature, so the probe marks were not able to be effaced by heating. Additionally, Comparative Example 2 had a high crosslinking density, so it was not possible to transcribe probe marks that were adequately recognizable.

Additionally, as is clear from Table 1, the cured resin of the curable resin composition according to the present invention can be formed to a thickness of roughly 20~100 μm. By forming the cured resin to this thickness, it is possible to adapt to the thickness of common semiconductor wafers. In other words, the probe marks transcribed onto the cured resin can be observed at the same focus and at the same time as the reference positions formed on the wafer, thereby enabling the work time to be shortened.

Furthermore, in Examples 1-3, 5 and 7, the composition of the curable resin composition is such that (A) occupies 5~100 parts by mass, (B) occupies 60 parts by mass or less, and with respect to a total of 100 parts by mass for (A) and (B), the amount of (C) is 0.1~20 parts by mass. As is clear from Table 1, a cured resin having a sufficient bond strength of at least 10 MPa can be obtained by such a composition.

Additionally, as shown in Example 9, if the glass transition temperature is high, the composition can be used even at high temperatures, and deep probe marks can be transcribed by raising the temperature during probe mark transcription. When transcribing probe marks onto a cured resin at high temperature, it is preferable to use (A) a monofunctional (meth)acrylate, and not use (B) a polyfunctional (meth)acrylate, since this enables the probe marks to be deeper and the probe marks to be more easily transcribed (Example 9). When wishing to increase the bonding ability, it is preferable to make combined use of (A) a monofunctional (meth)acrylate and (B) a polyfunctional (meth)acrylate (Example 1).

As described above, the present invention offers a probe inspection method used for repeated inspections, comprising steps of contacting probes for inspection of electrical properties of an object of inspection to a cured resin of a curable resin composition, transcribing probe marks of the probes to the cured resin, checking the condition of the probes based on the transcribed probe marks, and after transcribing the probe marks, heating the cured resin to at least the glass transition temperature of the cured resin to remove the probe marks.

The above-described inspection method has the effect of enabling repeated probe inspection without requiring replacement of the material for transcribing the probe marks with each inspection or type of wafer.

Additionally, the present invention offers a curable resin composition for transcribing probe marks of probes, comprising (A) a monofunctional (meth)acrylate and/or (meth)acrylamide, and (C) a photopolymerization initiator, having a glass transition temperature of 130° C. or less.

The above-described curable resin composition has the effect of enabling probe marks to be easily transcribed by contact with probes, and enabling the probe marks to be easily effaced by heating to at least the glass transition temperature.

The invention claimed is:

1. A probe inspection method, comprising:
   contacting probes for inspection of electrical properties of an object of inspection to a cured resin of a curable resin composition;
   transcribing probe marks of the probes to the cured resin;
   checking the condition of the probes based on the transcribed probe marks; and
   after transcribing the probe marks, heating the cured resin to at least the glass transition temperature of the cured resin to remove the probe marks.

2. The probe inspection method of claim 1, wherein the thickness of the cured resin of the curable resin composition is 20~100 μm.

3. The probe inspection method of claim 2, further comprising, after heating the cured resin to at least the glass transition temperature of the cured resin to remove the probe marks, thereby providing a heated cured resin,
   contacting probes for inspection of electrical properties of a different object of inspection to the heated cured resin;
   transcribing probe marks of the probes to the heated cured resin;
   checking the condition of the probes based on the transcribed probe marks.

4. The probe inspection method of claim 1, wherein the curable resin composition comprises (A) a monofunctional (meth)acrylate and/or a (meth)acrylamide; and (C) a photopolymerization initiator; and has a glass transition temperature of 130° C. or less.

5. The probe inspection method of claim 4, further comprising, after heating the cured resin to at least the glass transition temperature of the cured resin to remove the probe marks, thereby providing a heated cured resin,
   contacting probes for inspection of electrical properties of a different object of inspection to the heated cured resin;
   transcribing probe marks of the probes to the heated cured resin;
   checking the condition of the probes based on the transcribed probe marks.

6. The probe inspection method of claim 1, wherein the curable resin composition further comprises (B) a polyfunctional (meth)acrylate.

7. The probe inspection method of claim 6, further comprising, after heating the cured resin to at least the glass transition temperature of the cured resin to remove the probe marks, thereby providing a heated cured resin,
- contacting probes for inspection of electrical properties of a different object of inspection to the heated cured resin;
- transcribing probe marks of the probes to the heated cured resin;
- checking the condition of the probes based on the transcribed probe marks.

8. The probe inspection method of claim 1, wherein the curable resin composition further comprises a polymerization inhibitor.

9. The probe inspection method of claim 8, further comprising, after heating the cured resin to at least the glass transition temperature of the cured resin to remove the probe marks, thereby providing a heated cured resin,
- contacting probes for inspection of electrical properties of a different object of inspection to the heated cured resin;
- transcribing probe marks of the probes to the heated cured resin;
- checking the condition of the probes based on the transcribed probe marks.

10. The probe inspection method of claim 1, further comprising, after heating the cured resin to at least the glass transition temperature of the cured resin to remove the probe marks, thereby providing a heated cured resin,
- contacting probes for inspection of electrical properties of a different object of inspection to the heated cured resin;
- transcribing probe marks of the probes to the heated cured resin;
- checking the condition of the probes based on the transcribed probe marks.

11. The probe inspection method of claim 1, wherein the curable resin composition comprises 40~100 parts by mass of (A) a monofunctional (meth)acrylate and/or (meth)acrylamide; 60 parts by mass or less of (B) a polyfunctional (meth)acrylate; and (C) 0.1~20 parts by mass of (C) a photopolymerization initiator; when there is a total of 100 parts by mass of the (A) monofunctional (meth)acrylate and/or (meth)acrylamide and the (B) polyfunctional (meth)acrylate.

12. A curable resin composition, comprising 40~100 parts by mass of (A) a monofunctional (meth)acrylate and/or (meth)acrylamide; 60 parts by mass or less of (B) a polyfunctional (meth)acrylate; and 0.1~20 parts by mass of (C) a photopolymerization initiator; when there is a total of 100 parts by mass of the (A) monofunctional (meth)acrylate and/or (meth)acrylamide and the (B) polyfunctional (meth)acrylate, and having a glass transition temperature of 130° C. or less.

13. The curable resin composition of claim 12, further comprising a polymerization inhibitor.

14. A cured resin obtained by curing the curable resin composition of claim 12.

15. An inspection device for inspecting the electrical properties of an object of inspection, comprising:
- a sheet consisting of a cured resin;
- a support for holding the sheet;
- a heating device for heating the sheet to at least the glass transition temperature of the cured resin;
- a pedestal for holding an object of inspection;
- a probe card having probes, and
- an imaging device for observing the condition of probe marks transcribed onto the sheet,
- wherein the cured resin is obtained by curing a curable resin composition comprising (A) a monofunctional (meth)acrylate and/or a (meth)acrylamide; and (C) a photopolymerization initiator; and having a glass transition temperature of 130° C. or less.

16. The inspection device of claim 15, wherein the curable resin composition comprises 40~100 parts by mass of (A) a monofunctional (meth)acrylate and/or (meth)acrylamide; 60 parts by mass or less of (B) a polyfunctional (meth)acrylate; and (C) 0.1~20 parts by mass of (C) a photopolymerization initiator; when there is a total of 100 parts by mass of the (A) monofunctional (meth)acrylate and/or (meth)acrylamide and the (B) polyfunctional (meth)acrylate.

* * * * *